US009865608B2

(12) United States Patent
Mueller et al.

(10) Patent No.: US 9,865,608 B2
(45) Date of Patent: Jan. 9, 2018

(54) METHOD OF FORMING A DEVICE INCLUDING A FLOATING GATE ELECTRODE AND A LAYER OF FERROELECTRIC MATERIAL

(71) Applicants: GLOBALFOUNDRIES Inc., Grand Cayman (KY); Fraunhofer Gesellschaft zur Foerderung der angewandten Forschung e.V., Munich (DE); NaMLab gGmbH, Dresden (DE)

(72) Inventors: Johannes Mueller, Dresden (DE); Stefan Mueller, Dippoldiswalde (DE); Stefan Flachowsky, Dresden (DE)

(73) Assignees: GLOBALFOUNDRIES Inc., Grand Cayman (KY); Fraunhofer Gesellschaft zur Foerderung der angewandted Forschung e.V., Munich (DE); NaMLab gGmbH, Dresden (DE)

(*) Notice: Subject to any disclaimer, the term of this patent is extended or adjusted under 35 U.S.C. 154(b) by 0 days.

(21) Appl. No.: 15/162,151

(22) Filed: May 23, 2016

(65) Prior Publication Data
US 2016/0268271 A1    Sep. 15, 2016

Related U.S. Application Data

(62) Division of application No. 14/468,839, filed on Aug. 26, 2014, now abandoned.

(51) Int. Cl.
*H01L 27/115* (2017.01)
*H01L 29/66* (2006.01)
(Continued)

(52) U.S. Cl.
CPC .. *H01L 27/11507* (2013.01); *H01L 21/28291* (2013.01); *H01L 29/516* (2013.01);
(Continued)

(58) Field of Classification Search
CPC ............... H01L 29/516; H01L 29/6684; H01L 29/78391; H01L 21/28291
See application file for complete search history.

(56) References Cited

U.S. PATENT DOCUMENTS 5,877,977 A     3/1999  Essaian
6,828,160 B2 * 12/2004  Liu ................... H01L 27/11502
                                                    257/E21.663
(Continued)

OTHER PUBLICATIONS

Translation of Official Communication from corresponding German patent application No. 10 2015 213 529.2 dated Jun. 28, 2017.

*Primary Examiner* — Shaun Campbell
*Assistant Examiner* — Aneta Cieslewicz
(74) *Attorney, Agent, or Firm* — Amerson Law Firm, PLLC

(57) ABSTRACT

A method disclosed herein includes providing a semiconductor structure, the semiconductor structure comprising a semiconductor substrate and a gate stack, the gate stack comprising a gate insulation material over the substrate, a floating gate electrode material over the gate insulation material, a ferroelectric transistor dielectric over the floating gate electrode material and a top electrode material over the ferroelectric transistor dielectric, performing a first patterning process to remove portions of the top electrode material and the ferroelectric transistor dielectric and performing a second patterning process after the first patterning process to remove portions of the floating gate electrode material and the gate insulation material, wherein a projected area of an upper portion of the gate structure onto a plane that is perpendicular to a thickness direction of the substrate is smaller than a projected area of the lower portion of the gate structure onto the plane.

8 Claims, 12 Drawing Sheets

(51) Int. Cl.
*H01L 29/78* (2006.01)
*H01L 21/28* (2006.01)
*H01L 29/51* (2006.01)
*H01L 27/11507* (2017.01)

(52) U.S. Cl.
CPC .... *H01L 29/6684* (2013.01); *H01L 29/66545* (2013.01); *H01L 29/78391* (2014.09); *H01L 29/513* (2013.01); *H01L 29/517* (2013.01)

(56) References Cited

U.S. PATENT DOCUMENTS

| | | |
|---|---|---|
| 2002/0038402 A1 | 3/2002 | Kanaya |
| 2002/0149042 A1 | 10/2002 | Tarui et al. |
| 2005/0151210 A1 | 7/2005 | Li et al. |
| 2007/0132004 A1* | 6/2007 | Yasuda ............. H01L 21/28273 257/315 |
| 2008/0003697 A1 | 1/2008 | Li et al. |
| 2009/0045453 A1* | 2/2009 | Heo .................. H01L 21/28273 257/324 |
| 2010/0015729 A1 | 1/2010 | Choi et al. |
| 2015/0070964 A1 | 3/2015 | Yamada et al. |

\* cited by examiner

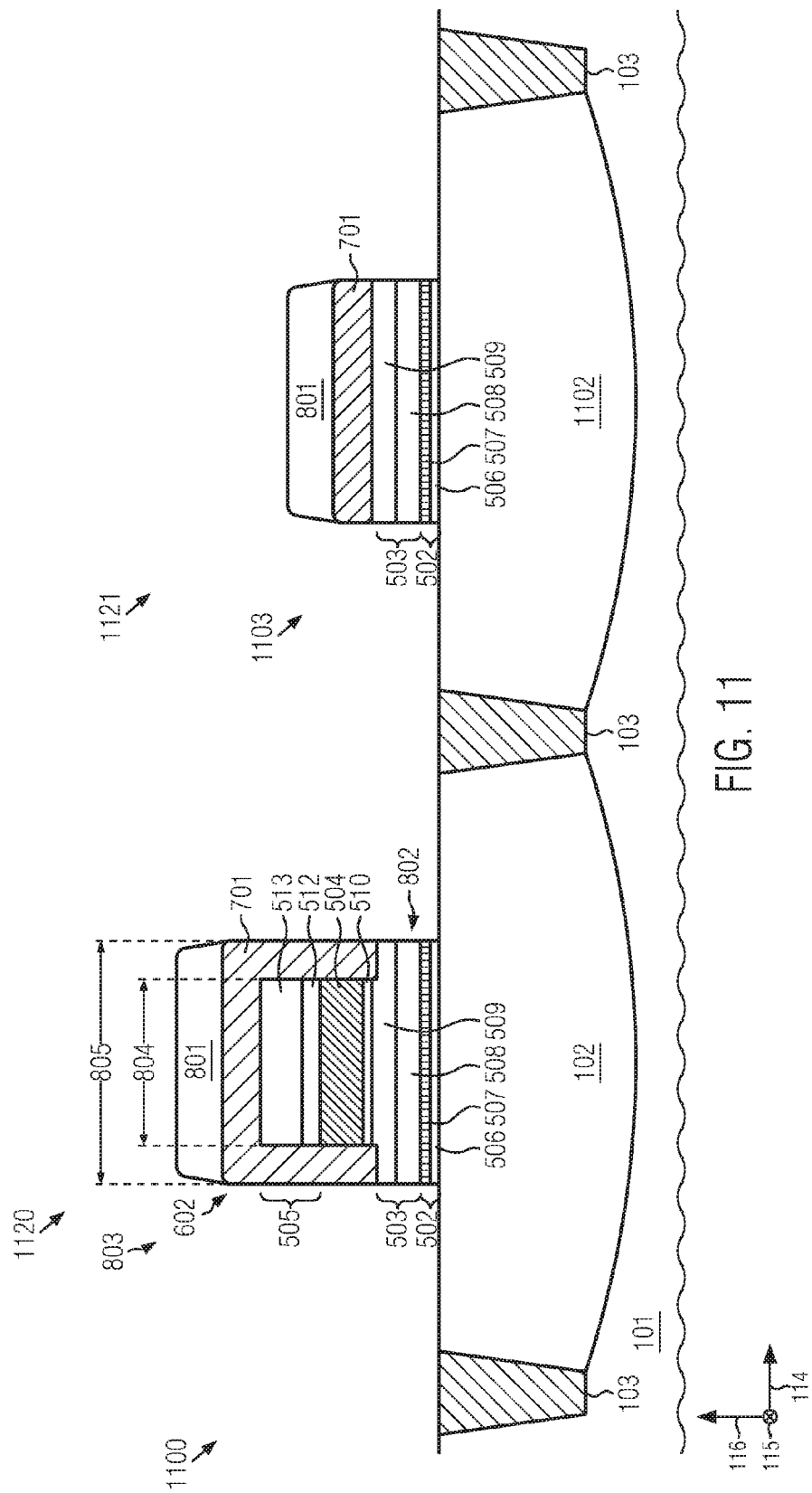

US 9,865,608 B2

1

METHOD OF FORMING A DEVICE INCLUDING A FLOATING GATE ELECTRODE AND A LAYER OF FERROELECTRIC MATERIAL

BACKGROUND OF THE INVENTION

1. Field of the Invention

Generally, the present disclosure relates to the field of integrated circuits, and, in particular, to integrated circuits including ferroelectric memory.

2. Description of the Related Art Integrated circuits typically include a large number of circuit elements, which form an electric circuit. The circuit elements in an integrated circuit may be electrically connected by means of electrically conductive metal lines formed in an interlayer dielectric material. The electrically conductive metal lines may be provided in a plurality of interconnect layers that are stacked on top of each other above a substrate in and on which circuit elements, such as field effect transistors and other circuit elements such as capacitors, diodes and resistors, are formed. Metal lines in different interconnect layers may be electrically connected with each other by means of contact vias that are filled with metal.

Integrated circuits may include nonvolatile memory. In some types of nonvolatile memory, ferroelectric materials may be employed. Ferroelectric materials can maintain an electric polarization in the absence of an external electrical field. Different directions of the electrical polarization of a small amount of ferroelectric material which may be provided, for example, in a gate structure of a field effect transistor or between the electrodes of a capacitor may be used to represent a bit of information, wherein a first polarization direction is identified with a logical 0, and a second polarization direction is identified with a logical 1.

U.S. Pat. No. 5,877,977 discloses a type of nonvolatile memory that is based on a metal-ferroelectric-metal-insulator-semiconductor field effect transistor (MFMIS-FET) structure. The MFMIS-FET structure includes a source region, a channel region and a drain region. Above the channel region, a ferroelectric layer arranged between upper and lower electrodes and a silicon oxynitride gate insulation layer are provided. The gate insulation layer is arranged between the channel region and the lower electrode. Thus, an arrangement that is electrically analogous to two capacitors in series is provided. A first capacitor is provided by the upper and lower electrodes, with the ferroelectric layer arranged as a capacitor dielectric therebetween, and a second capacitor is provided by the channel region and the lower electrode as capacitor electrodes, with the gate insulation layer arranged therebetween as a capacitor dielectric.

When a bias voltage is applied to the upper electrode, a remanent polarization of the ferroelectric layer may be obtained, wherein the direction of the remanent polarization depends on whether the bias voltage is positive or negative. The direction of the remanent polarization may be identified with the value of a bit stored in the MFMIS-FET.

The remanent polarization of the ferroelectric layer may have an influence on the electrical conductivity of the channel region that is obtained in the absence of a bias voltage applied to the upper electrode. Therefore, the bit of information stored in the MFMIS-FET device may be read by sensing whether the MFMIS-FET is in an "ON" state or in an "OFF" state when no bias voltage is applied to the upper electrode.

The applicability of an MFMIS-FET structure as described above may depend on a ratio between a capaci-

2 tance of the first capacitor formed by the upper and lower electrodes and the ferroelectric layer, and the second capacitor formed by the lower electrode, the gate insulation layer and the channel region. A relatively small capacitance of the first capacitor as compared to the capacitance of the second capacitor may have the advantage of reducing the bias voltage that needs to be applied between the upper electrode and the channel region for applying a particular external electric field to the ferroelectric layer. However, the possibilities of tuning the thicknesses and dielectric constants of the ferroelectric layer and the gate insulation layer may be limited.

Embodiments of the present disclosure provide devices that address this issue and methods for the formation of such devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure, the semiconductor structure comprising a semiconductor substrate and a gate stack, the gate stack comprising a gate insulation material over the substrate, a floating gate electrode material over the gate insulation material, a ferroelectric transistor dielectric over the floating gate electrode material and a top electrode material over the ferroelectric transistor dielectric, performing a first patterning process, the first patterning process removing portions of the top electrode material and the ferroelectric transistor dielectric, portions of the top electrode material and the ferroelectric transistor dielectric that are not removed in the first patterning process forming an upper portion of a gate structure, portions of the floating gate electrode material and the gate insulation material that are not covered by the upper portion of the gate structure remaining in the semiconductor structure, and performing a second patterning process after the first patterning process, the second patterning process removing portions of the floating gate electrode material and the gate insulation material, portions of the floating gate electrode material and the gate insulation material that are not removed in the second patterning process forming a lower portion of the gate structure, wherein a projected area of the upper portion of the gate structure onto a plane that is perpendicular to a thickness direction of the substrate is smaller than a projected area of the lower portion of the gate structure onto the plane.

Another illustrative method disclosed herein includes providing a semiconductor structure, the semiconductor structure comprising a semiconductor substrate and a gate stack, the gate stack comprising a gate insulation material over the substrate, a floating gate electrode material over the gate insulation material, a ferroelectric transistor dielectric over the floating gate electrode material and a top electrode material over the ferroelectric transistor dielectric, performing a first patterning process, the first patterning process removing portions of the top electrode material and the ferroelectric transistor dielectric, portions of the top electrode material and the ferroelectric transistor dielectric that are not removed in the first patterning process forming an upper portion of a gate structure, portions of the floating gate electrode material and the gate insulation material that are not covered by the upper portion of the gate structure remaining in the semiconductor structure, forming a liner layer above the gate stack after performing the first patterning process, forming a mask layer above a portion of the liner layer above the upper portion of the gate structure, and performing a second patterning process after the first patterning process using the liner layer and the mask layer, the second patterning process removing portions of the first liner layer, the floating gate electrode material, and the gate insulation material not covered by the mask layer, portions of the floating gate electrode material and the gate insulation material that are not removed in the second patterning process forming a lower portion of the gate structure, wherein a projected area of the upper portion of the gate structure onto a plane that is perpendicular to a thickness direction of the substrate is smaller than a projected area of the lower portion of the gate structure onto the plane.

BRIEF DESCRIPTION OF THE DRAWINGS

The disclosure may be understood by reference to the following description taken in conjunction with the accompanying drawings, in which like reference numerals identify like elements, and in which:

FIG. 11 shows a schematic view of a semiconductor structure according to an embodiment in a stage of a manufacturing process according to an embodiment.

Figure 1:
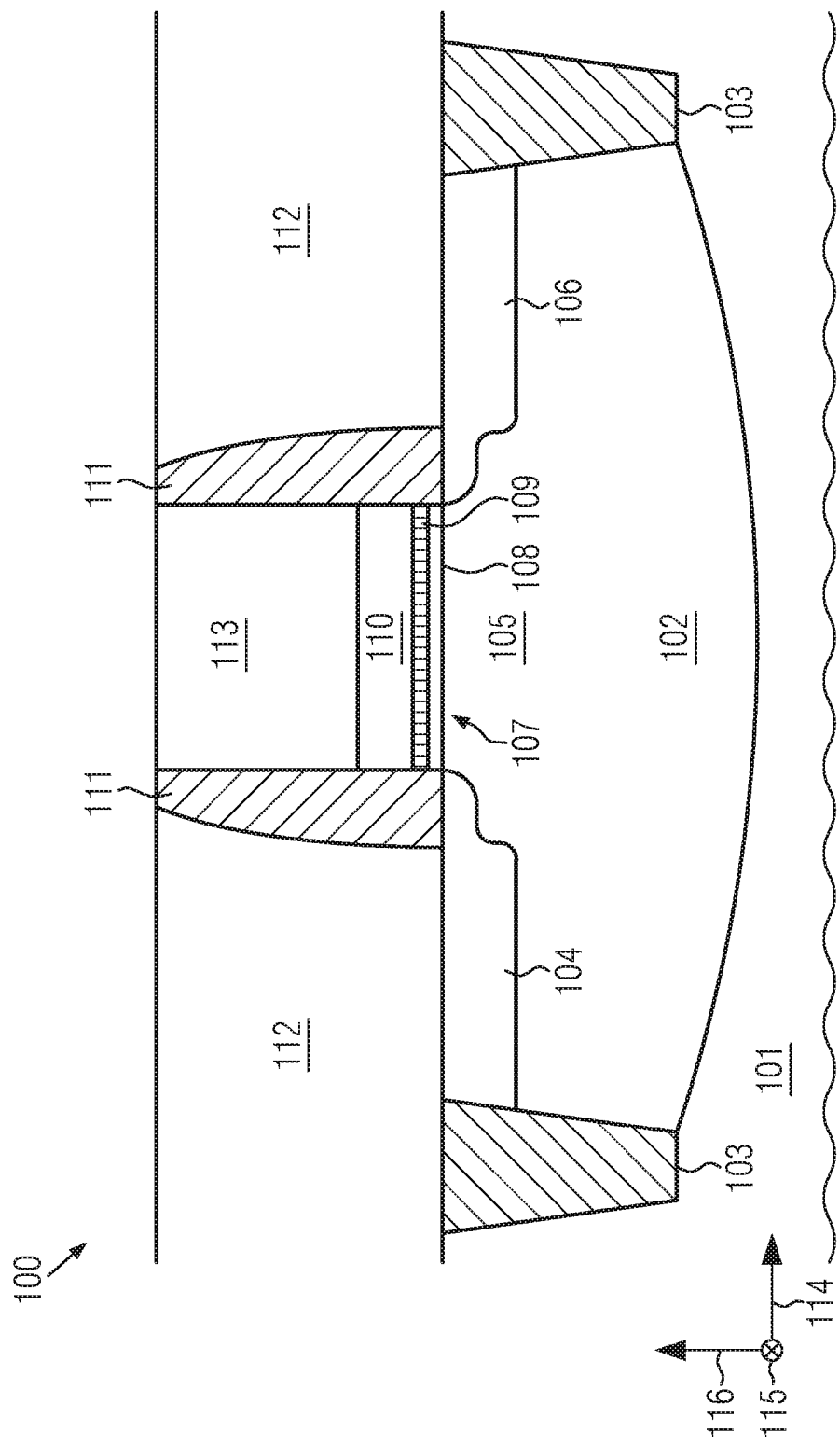
FIGS. 1-4 show schematic views of a semiconductor structure according to an embodiment in stages of a manufacturing process according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Embodiments of the present disclosure provide metal-ferroelectric-metal-insulator-semiconductor field effect transistor (MFMIS-FET) devices wherein a ferroelectric material including an oxide of hafnium and/or zirconium, for example hafnium dioxide, is employed. Compared to complex perovskite systems which are conventionally employed in ferroelectric nonvolatile memories for embedded and standalone devices, these materials may have advantages associated therewith, such as a better scalability and a better compatibility with front end-of-line and back end-of-line processes employed in the manufacturing of integrated circuits. Ferroelectric materials that are based on oxides of hafnium and/or zirconium may be compatible with high-k metal gate (HKMG) manufacturing processes and provide scalability at least down to the 28 nm technology node.

In embodiments disclosed herein, areas of capacitors including the ferroelectric material and a gate insulation layer, respectively, may be scaled separately. Thus, an intrinsic capacitance area variation may be provided, which may help to improve an electric field distribution in a stack, thus improving the endurance of an MFMIS-FET device. For manufacturing devices as disclosed herein, gate-last as well as gate-first integration schemes may be employed.

FIG. 1 shows a schematic cross-sectional view of a semiconductor structure 100 according to an embodiment in a stage of a manufacturing process according to an embodiment. In the semiconductor structure 100, an MFMIS-FET will be formed, as will be described in the following with reference to FIGS. 1-4.

The semiconductor structure 100 includes a semiconductor substrate 101. The substrate 101 may be a bulk semiconductor substrate, for example a silicon wafer or die. In other embodiments, the substrate 101 may be a semiconductor-on-insulator (SOI) substrate including a layer of a semiconductor material, for example silicon, that is used for forming semiconductor circuit elements and is separated from a support substrate such as, for example, a silicon wafer, by a layer of an electrically insulating material, such as silicon dioxide.

The substrate 101 has a thickness direction 116. An extension of the substrate 101 in the thickness direction 116 may be smaller than any extension of the substrate 101 in any direction other than the thickness direction 116. In embodiments wherein the substrate 101 is a wafer or die, the thickness direction 116 may be substantially perpendicular to a main surface of the wafer or die on which semiconductor circuit elements are formed. Reference numerals 114, 115 denote horizontal directions which are perpendicular to each other and to the thickness direction 116 and substantially parallel to the main surface of the substrate 101. In the figures, directions that are perpendicular to the plane of drawing and point away from the viewer are shown as a circle with an "x" at the center, and directions that are perpendicular to the plane of drawing and point to the viewer are shown as a circle with a point at the center.

The substrate 101 may include an active region 102. In the active region 102, a source region 104, a channel region 105 and a drain region 106 may be provided. The source region 104 and the drain region 106 may be doped differently than portions of the active region 102 outside the source region 104 and the drain region 106. In particular, the source region 104 and the drain region 106 may be doped differently than the channel region 105. In some embodiments, the source region 104 and the drain region 106 may be P-doped, and the channel region 105 may be N-doped. In other embodiments, the source region 104 and the drain region 106 may be N-doped, and the channel region 105 may be P-doped. The semiconductor structure 100 may include a trench isolation structure 103 that provides electrical insulation between the active region 102 and other regions of the semiconductor structure 100, which are not shown in FIG. 1.

Over the channel region 105, a gate insulation layer 107 may be provided. The gate insulation layer 107 may include sub-layers 108, 109. Sub-layer 108, which may be provided directly on the semiconductor material of the substrate 101 in the channel region 105, may include silicon dioxide, and sub-layer 109, which may be provided on the sub-layer 108, may include a dielectric material having a greater dielectric constant than silicon dioxide, for example, hafnium dioxide or another high-k dielectric material.

Over the gate insulation layer 107, a floating gate electrode 110 may be provided. The floating gate electrode 110 may include an electrically conductive material. In some embodiments, the floating gate electrode 110 may include a metal or a metal compound, for example, tantalum nitride and/or titanium nitride. In other embodiments, the floating gate electrode 110 may include a semiconductor material, for example polysilicon and/or amorphous silicon. In such embodiments, the semiconductor material of the floating gate electrode 110 may be doped for providing a relatively high electrical conductivity of the floating gate electrode. In further embodiments, the floating gate electrode 110 may include sub-layers formed of different materials, for example, a first sub-layer including a metal or a metal compound and a second sub-layer that is provided above the first sub-layer and includes a semiconductor material such as polysilicon and/or amorphous silicon.

Over the floating gate electrode 110, a dummy gate electrode 113 may be provided. The dummy gate electrode 113 may include amorphous silicon and/or polysilicon. In embodiments wherein the dummy gate electrode 113 and the floating gate electrode 110 are formed of substantially the same material, for example polysilicon, an etch stop layer (not shown), for example a layer including silicon dioxide and/or silicon nitride, may be provided between the floating gate electrode 110 and the dummy gate electrode 113.

Adjacent the gate insulation layer 107, the floating gate electrode 110 and the dummy gate electrode 113, a sidewall spacer 111 may be provided. The sidewall spacer 111 may be an annular feature that annularly encloses the gate insulation layer 107, the floating gate electrode 110 and the dummy gate electrode 113, as illustrated in FIG. 3b, which shows a schematic top view of the semiconductor structure 100 in a later stage of the manufacturing process.

The semiconductor structure 100 may further include an interlayer dielectric 112 adjacent the sidewall spacer 111. In particular, the interlayer dielectric 112 may be provided over portions of the source region 104 and the drain region 106 that are not covered by the sidewall spacer 111 and over the trench isolation structure 103. In the stage of the manufacturing process illustrated in FIG. 1, the semiconductor structure 100 may have a substantially planar surface, wherein the interlayer dielectric 112, the sidewall spacer 111 and the dummy gate electrode 113 are exposed at the surface of the semiconductor structure 100.

As illustrated in FIG. 1, the source region 104 and the drain region 106 may be spaced apart along the horizontal direction 114, so that a distance between the source region 104 and the drain region 106 along the horizontal direction 114 defines a channel length of the channel region 105. Therefore, the horizontal direction 114 will sometimes be denoted as "channel length direction" herein. An extension of the channel region 105 in the horizontal direction 115, which is perpendicular to the channel length direction 114, defines a channel width of the channel region 105, so that the horizontal direction 115 will sometimes be denoted as "channel width direction" herein.

The features of the semiconductor structure 100 illustrated in FIG. 1 may be formed by means of known techniques of semiconductor processing. In particular, techniques of ion implantation may be employed for introducing dopants into the active region 102 and the shallow trench isolation structure 103 may be formed by means of techniques of photolithography, etching, oxidation, deposition and/or chemical mechanical polishing.

After the formation of the active region 102 and the shallow trench isolation structure 103, layers of materials of the gate insulation layer 107, the floating gate electrode 110 and the dummy gate electrode 113 may be deposited and patterned by means of techniques of photolithography and etching. The patterning forms a gate structure including the gate insulation layer 104, the floating gate electrode 110 and the dummy gate electrode 113 as shown in FIG. 1.

Thereafter, the sidewall spacer 111 may be formed by substantially isotropically depositing a layer of a material of the sidewall spacer 111, for example a silicon nitride layer, and performing an anisotropic etch process for removing portions of the layer of the material of the sidewall spacer 111 from substantially horizontal portions of the semiconductor structure 100.

For forming the source region 104 and the drain region 106, ion implantation processes may be employed, wherein ion implantations may be performed both before the formation of the sidewall spacer 111 and after the formation of the sidewall spacer 111 for obtaining a desired dopant profile in regions of the source region 104 and the drain region 106 adjacent the channel region 105, as schematically illustrated in FIG. 1. Thereafter, a layer of a material of the interlayer dielectric 112, for example a layer of silicon dioxide, may be deposited, and a chemical mechanical polishing process may be performed for obtaining a substantially planar surface of the semiconductor structure 100 and for exposing the sidewall spacer 111 and the dummy gate electrode 113.

Figure 2:
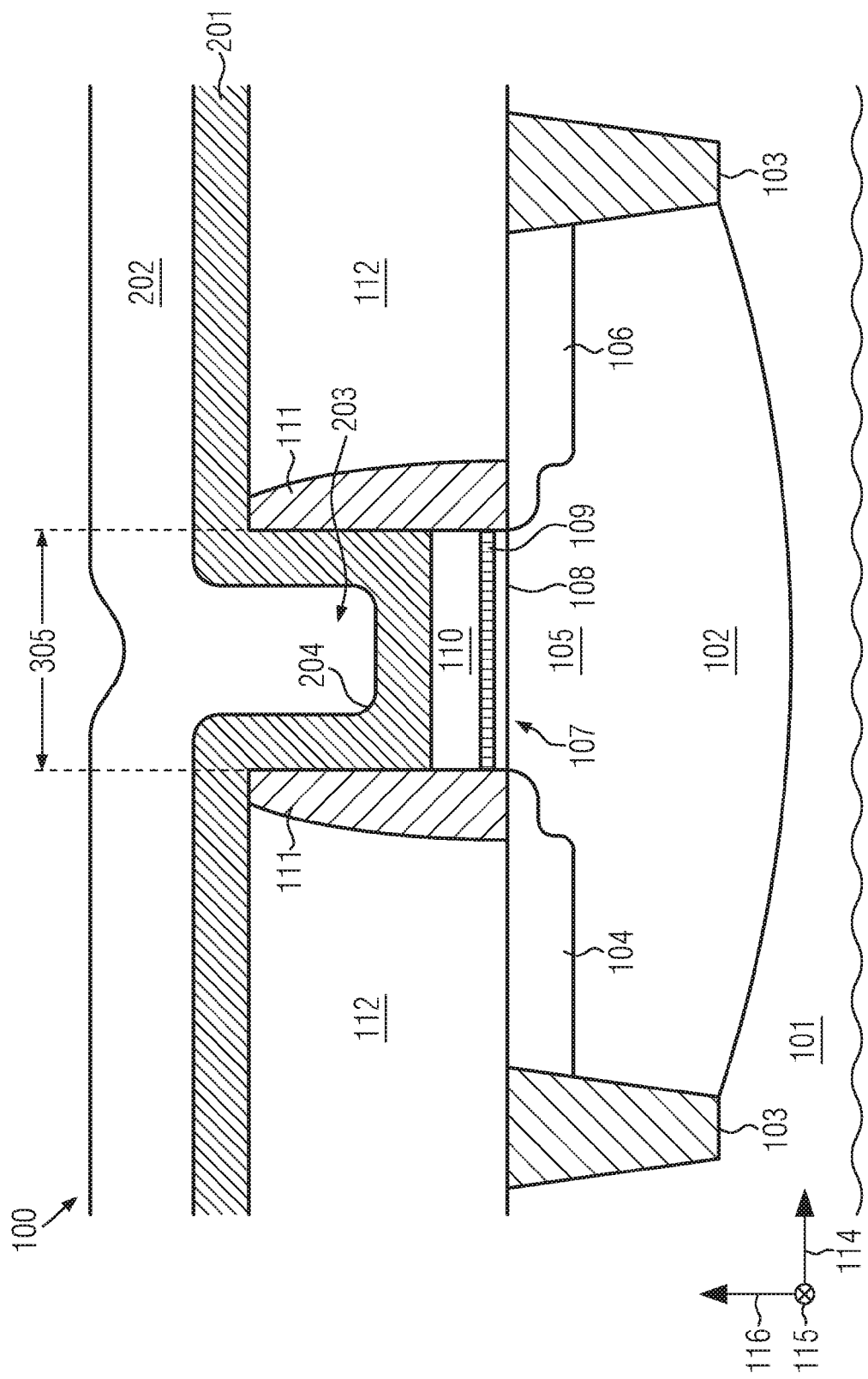

FIG. 2 shows a schematic cross-sectional view of the semiconductor structure 100 in a later stage of the manufacturing process. The dummy gate electrode 113 may be removed. This may be done by means of an etch process adapted to selectively remove the material of the dummy gate electrode 113 relative to the materials of the sidewall spacer 111 and the interlayer dielectric 112. Furthermore, the etch process may have an etch selectivity for selectively etching the material of the dummy gate electrode 113 relative to the material of the floating gate electrode 110 or, in embodiments wherein an etch stop layer is provided between the floating gate electrode 110 and the dummy gate electrode 113, the material of the etch stop layer. The etch process employed for removing the dummy gate electrode 113 may be a dry etch process, for example, a reactive ion etch process. In embodiments wherein an etch stop layer is provided between the floating gate electrode 110 and the dummy gate electrode 113, after the removal of the dummy gate electrode 113, a further etch process may be performed for removing the etch stop layer so that the floating gate electrode 110 is exposed at the surface of the semiconductor structure 100.

The removal of the dummy gate electrode 113 forms an empty space 203 above the floating gate electrode 110 that was occupied by the dummy gate electrode 113 before the removal of the dummy gate electrode 113. The sidewall spacer 111 is arranged adjacent the floating gate electrode 110 and the gate insulation layer 107 and extends beyond the floating gate electrode 110 in the thickness direction 116 of the substrate 101, so that the space 203 above the floating gate electrode 110 is annularly enclosed by the sidewall spacer 111. An extension of the space 203 in the channel length direction 114 is approximately equal to an extension 305 of the floating gate electrode 110 in the channel length direction 114. Moreover, an extension of the space 203 in the channel width direction 115 is approximately equal to an extension 306 (see FIG. 3B) of the floating gate electrode 110 in the channel width direction 115.

A ferroelectric transistor dielectric 201 may be deposited over the semiconductor structure 100. A portion of the ferroelectric transistor dielectric 201 is deposited in the space 203 above the floating gate electrode 110, so that the floating gate electrode 110 is covered by the ferroelectric transistor dielectric 201. Furthermore, portions of the ferroelectric transistor dielectric 201 may cover walls of the sidewall spacer 111 that surround the space 203. A thickness of the ferroelectric transistor dielectric 201 may be smaller than an extension of the space 203 in the thickness direction 116 of the substrate 101 and smaller than the extension of the space 203 in the horizontal directions 114, 115 so that the space 203 is not completely filled with the ferroelectric transistor dielectric 201 and the portion of the ferroelectric transistor dielectric 201 in the space 203 has a recess 204, a lower part of the recess 204 extending into the space 203.

The ferroelectric transistor dielectric 201 may be a ferroelectric dielectric material which already has ferroelectric properties directly after the deposition of the ferroelectric dielectric material or a material that obtains ferroelectric properties when further processing steps are performed after the deposition of the ferroelectric transistor dielectric 201. Such further processing steps may include, for example, an annealing, as will be detailed below.

In some embodiments, the ferroelectric transistor dielectric 201 may include hafnium dioxide, zirconium dioxide and/or hafnium zirconium dioxide.

The ferroelectric transistor dielectric 201 may be doped. For example, in some embodiments, the ferroelectric transistor dielectric 201 may include silicon-doped hafnium dioxide. Aluminum-doped hafnium dioxide, strontium-doped hafnium dioxide, yttrium-doped hafnium dioxide, gadolinium-doped hafnium dioxide and/or other rare earth doped hafnium oxide systems may also be employed. In further embodiments, the ferroelectric transistor dielectric 201 may include substantially undoped hafnium dioxide. In some embodiments, the deposition process used for depositing the ferroelectric transistor dielectric 201 may be adapted such that the as-deposited material is substantially amorphous and does not have ferroelectric properties.

In embodiments wherein the ferroelectric transistor dielectric 201 includes silicon-doped hafnium dioxide, an atomic layer deposition (ALD) process may be performed for depositing the ferroelectric transistor dielectric 201. In the atomic layer deposition process, tetrakis-(ethylmethylamino)-hafnium, tetrakis-dimethylamino-silane and ozone may be employed. In some embodiments, metal organic precursors and/or halide precursors may additionally be used. The atomic layer deposition may be performed at a temperature of less than 500° C., for example at a temperature in a range from about 200-400° C., in particular at a temperature of about 350° C. A silicon content of the ferroelectric transistor dielectric 201 may be in a range from about 2-5 mol %, in particular in a range from about 2.5-4.5 mol %. The silicon content of the ferroelectric transistor dielectric 201 may be controlled by varying the composition of gases employed in the atomic layer deposition process. Depositing the ferroelectric transistor dielectric 201 at a relatively low temperature as described above may help to obtain an amorphous structure of the as-deposited ferroelectric transistor dielectric 201.

In embodiments wherein the ferroelectric transistor dielectric 201 includes aluminum-doped hafnium dioxide, yttrium-doped hafnium dioxide or gadolinium-doped hafnium dioxide, an ALD process wherein tetrakis-(ethylmethylamino)-hafnium, hafnium tetrachloride, as well as ozone and/or water, are used may be employed. Furthermore, depending on whether the ferroelectric transistor dielectric 201 includes aluminum, yttrium or gadolinium, trimethylaluminum, tetrakis(methylcyclopentadienyl)yttrium or tris(isopropylcyclopentane)gadolinium may be used. Further parameters of the atomic layer deposition process may correspond to those described above in the context of embodiments wherein the ferroelectric transistor dielectric 201 includes silicon-doped hafnium dioxide.

In embodiments wherein the ferroelectric transistor dielectric 201 includes substantially undoped hafnium dioxide, a chemical vapor deposition process may be used for forming the ferroelectric transistor dielectric 201, wherein materials and/or parameters corresponding to the embodiments described above are used but the substances provided for doping the ferroelectric transistor dielectric 201 are omitted.

In embodiments wherein the ferroelectric transistor dielectric 201 includes hafnium zirconium dioxide, an ALD process wherein tetrakis(ethylmethylamino)zirconium, tetrakis(ethylmethylamino)hafnium and ozone are used may be performed for depositing the ferroelectric transistor dielectric 201. In some embodiments, the hafnium zirconium dioxide may have a composition in accordance with the formula $Hf_xZr_{1-x}O_2$, for example a composition in accordance with the formula $Hf_{0.5}Zr_{0.5}O_2$. Further parameters of the atomic layer deposition process may correspond to those described above in the context of embodiments wherein the ferroelectric transistor dielectric 201 includes silicon-doped hafnium dioxide.

In embodiments wherein the ferroelectric transistor dielectric 201 includes zirconium dioxide, deposition processes similar to those described above in the context of embodiments wherein the ferroelectric transistor dielectric 201 includes hafnium dioxide may be used, wherein reactants including zirconium are employed instead of reactants including hafnium. In particular, tetrakis(ethylmethylamino) zirconium may be used instead of tetrakis(ethylmethylamino)hafnium, and zirconium tetrachloride may be used instead of hafnium tetrachloride.

After the deposition of the ferroelectric transistor dielectric, an electrically conductive material 202, such as titanium nitride, may be deposited. For depositing the electrically conductive material 202, deposition techniques such as atomic layer deposition, chemical vapor deposition, plasma enhanced chemical vapor deposition and/or physical vapor deposition may be employed.

In some embodiments, after the deposition of the electrically conductive material 202, an annealing process may be performed for crystallizing the ferroelectric transistor dielectric 201. Due to the crystallization of the ferroelectric transistor dielectric 201 in the presence of the electrically conductive material 202 thereon, a crystal structure of the ferroelectric transistor dielectric 201 having ferroelectric properties may be obtained. The annealing process may be a rapid thermal annealing process wherein the semiconductor structure 100 is exposed to a temperature in a range from about 300-800° C., for example, a temperature in a range from about 300-500° C.

The annealing process need not be performed directly after the deposition of the electrically conductive material 202. In other embodiments, the annealing process may be performed at a later point in time, for example, after removing portions of the ferroelectric transistor dielectric 201 and the electrically conductive material 202 outside the space 203 above the floating gate electrode 110, as will be described in the following with reference to FIGS. 3A and 3B.

Figure 3A:
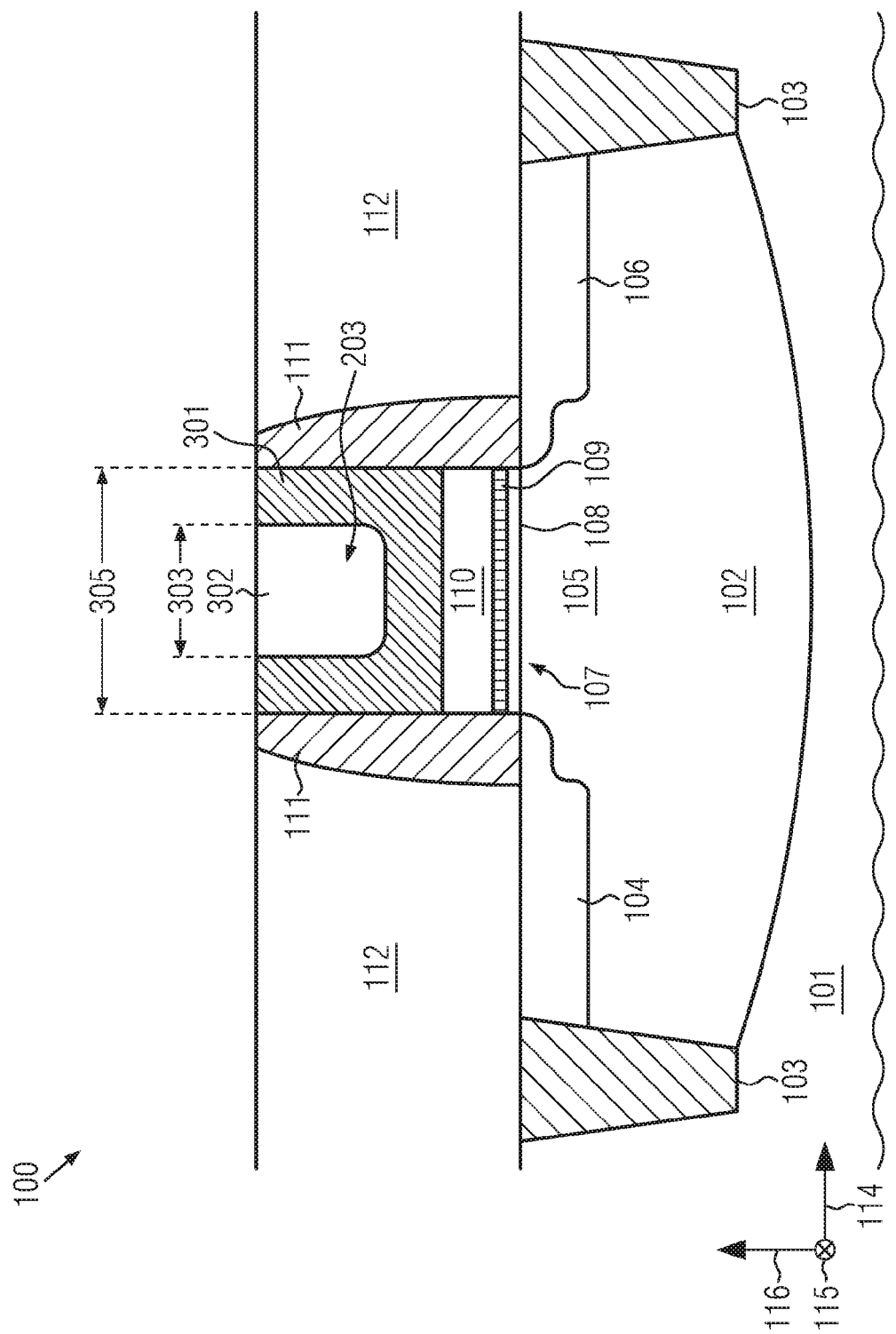
Figure 3B:
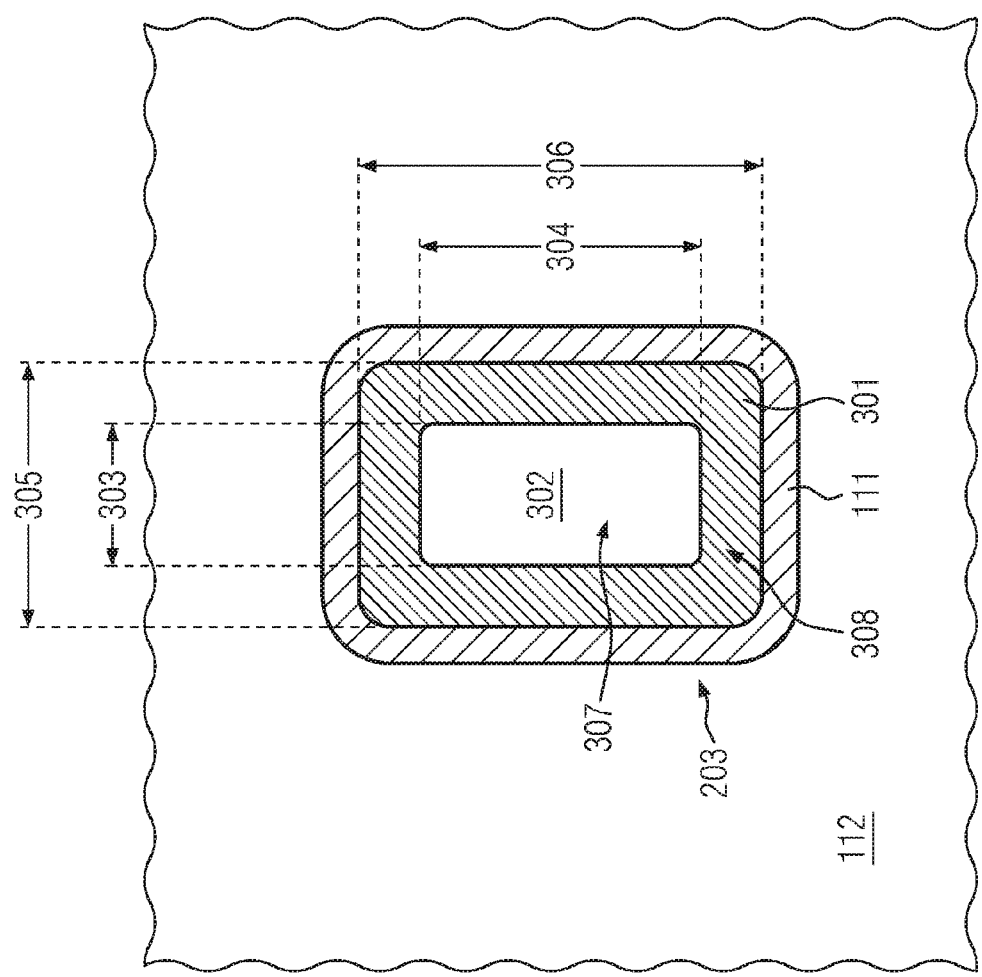

FIGS. 3A and 3B show schematic views of the semiconductor structure 100 in a later stage of the manufacturing process. FIG. 3A shows a schematic cross-sectional view, similar to the cross-sectional views of FIGS. 1 and 2. FIG. 3B shows a schematic top view of the semiconductor structure 100 from a direction that is opposite to the thickness direction 116 (from top to bottom in the plane of drawing of FIG. 3A).

A chemical mechanical polishing process may be performed for removing portions of the ferroelectric transistor dielectric 201 and the electrically conductive material 202 outside the space 203 above the floating gate electrode 110. In doing so, a substantially planar surface of the semiconductor structure 100 may be obtained, and the interlayer dielectric 112, the sidewall spacer 111 as well as the ferroelectric transistor dielectric 301 may be exposed at the surface of the semiconductor structure 100.

A portion of the electrically conductive material 202 in the recess 204 of the ferroelectric transistor dielectric 201 may remain in the semiconductor structure 100 after the chemical mechanical polishing process and may form a top electrode 302. The portion of the ferroelectric transistor dielectric 201 in the space 203 above the floating gate electrode 110 also remains in the semiconductor structure 100 and forms a layer 301 of ferroelectric material between the top electrode 302 and the floating gate electrode 110.

The floating gate electrode 110 is enclosed by the gate insulation layer 107, the sidewall spacer 111 and the layer 301 of ferroelectric material, which are each formed of electrically insulating materials. Thus, the floating gate electrode 110 is electrically floating.

The top electrode 302 and the floating gate electrode 110 form a first capacitor with the layer 301 of ferroelectric material therebetween providing a capacitor dielectric. The floating gate electrode 110 and the channel region 105 form a second capacitor, the gate insulation layer 107 providing a capacitor dielectric of the second capacitor.

As can be seen in the top view of FIG. 3B, since the floating gate electrode 110 contacts the sidewall spacer 111 that annularly encloses the floating gate electrode 110, and the layer 301 of ferroelectric material is arranged between the top electrode 302 and the sidewall spacer 111, an extension 303 of the top electrode 302 in the channel length direction 114 is smaller than the extension 305 of the floating gate electrode 110 in the channel length direction 114. Similarly, an extension 304 of the top electrode 302 in the channel width direction 115 is smaller than the extension 306 of the floating gate electrode 110 in the channel width direction 115. Therefore, a projected area 307 of the top electrode 302 on a plane that is perpendicular to a thickness direction 116 of the substrate 101 is smaller than a projected area 308 of the floating gate electrode 110 onto the plane perpendicular to the thickness direction 116 of the substrate 101. The plane perpendicular to the thickness direction 116 corresponds to the plane of drawing of FIG. 3B and is spanned by vectors parallel to the channel length direction 114 and the channel width direction 115.

A capacitance of the first capacitor that is formed by the top electrode 302, the layer 301 of ferroelectric material and the floating gate electrode 110 may depend on the thickness of the layer 301 of ferroelectric material, which represents the spacing between the top electrode 302 and the floating gate electrode 110, and on the dielectric constant of the layer 301 of ferroelectric material. Additionally, the capacitance of the first capacitor depends on the geometry of the top electrode 302 and the floating gate electrode 110. In particular, a reduction of the projected area of the top electrode 302 onto the plane that is perpendicular to the thickness direction 116 may lead to a smaller capacitance of the first capacitor.

To the contrary, the capacitance of the second capacitor that is formed by the floating gate electrode 110 and the channel region 105 substantially does not depend on the projected area of the top electrode 302 onto the plane perpendicular to the thickness direction 116 of the substrate 101.

Thus, an arrangement of the top electrode 302, the floating gate electrode 110 and the channel region 105 as described above, wherein the projected area 307 of the top electrode 302 onto a plane that is perpendicular to the thickness direction 116 is smaller than the projected area 308 of the floating gate electrode 110 onto the plane may help to reduce a ratio between the capacitance of the first capacitor provided by the top electrode 302, the floating gate electrode 110 and the layer 301 of ferroelectric material and the capacitance of the second capacitor provided by the floating gate electrode 110, the channel region 105 and the gate insulation layer 107.

This may help to reduce a voltage that needs to be applied between the top electrode 302 and the channel region 105 for applying a particular external electrical field to the layer 301 of ferroelectric material. Thus, a voltage that needs to be applied for setting a remanent polarization of the layer 301 of ferroelectric material may be reduced compared to configurations wherein the top electrode 302 extends across the entire space 203 that is annularly enclosed by the sidewall spacer 111.

Figure 4:
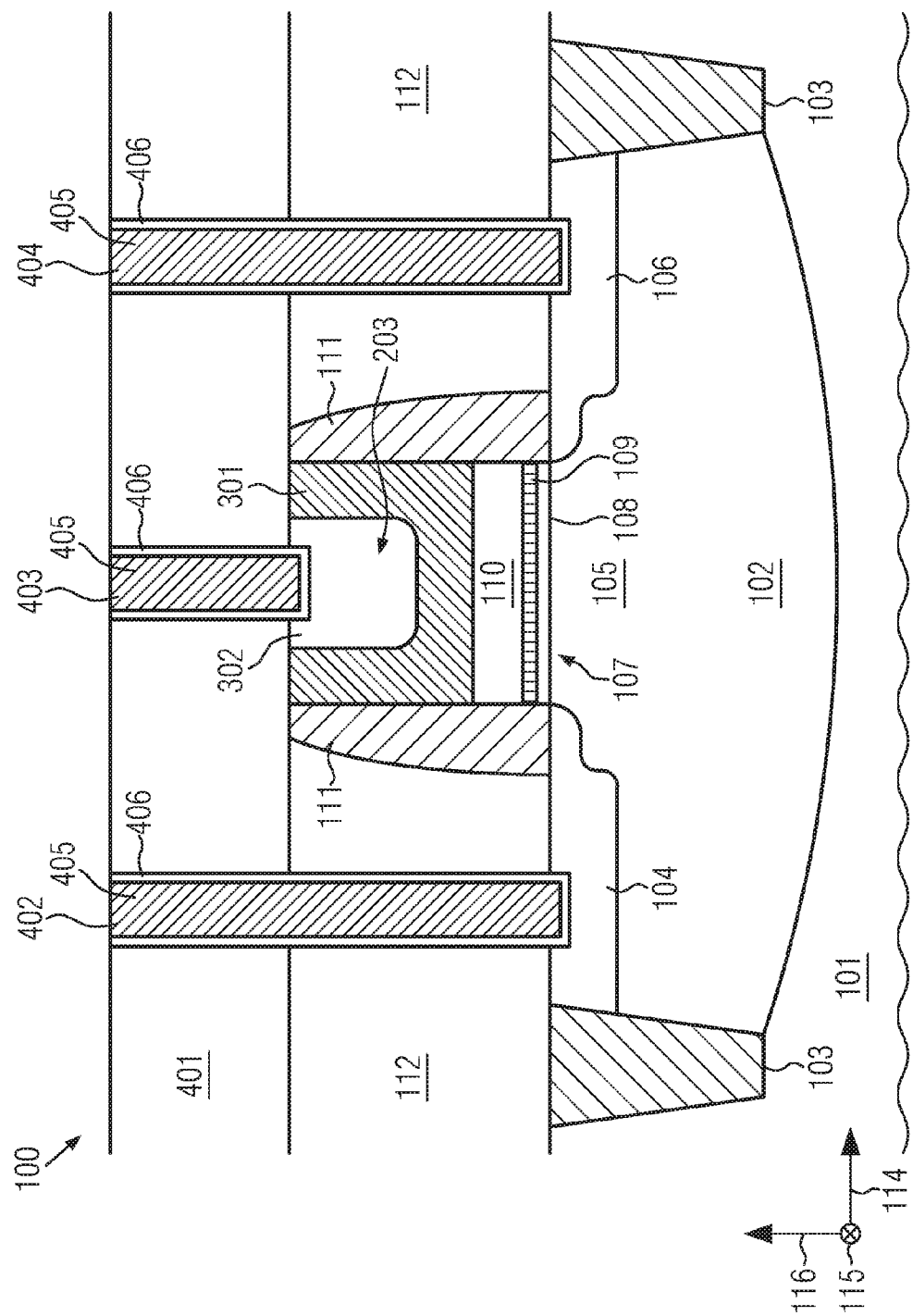

FIG. 4 shows a schematic cross-sectional view of the semiconductor structure 100 in a later stage of the manufacturing process. A further interlayer dielectric 401 may be deposited over the semiconductor structure 100. Similar to the interlayer dielectric 112, the interlayer dielectric 401 may include silicon dioxide. Alternatively, a low-k dielectric material having a smaller dielectric constant than silicon dioxide may be used. For forming the interlayer dielectric 401, conventional techniques for forming interlayer dielectric materials, such as chemical vapor deposition, plasma-enhanced chemical vapor deposition and/or spin coating, may be employed.

Thereafter, contact vias 402, 403, 404 may be formed in the interlayer dielectrics 401, 112. This may be done by means of techniques of photolithography and etching. Thereafter, the contact vias 402, 403, 404 may be filled with an electrically conductive material 405, for example, a metal such as tungsten. A barrier layer 406, which may also improve the adhesion between the electrically conductive material 405 and the interlayer dielectrics 112, 401, may be provided at the side and bottom surfaces of the contact vias 402, 403, 404.

The contact vias 402, 403, 404, when filled with the electrically conductive material 405, provide electrical connections to the source region 104, the top electrode 302 and the drain region 106, respectively.

The features illustrated in FIG. 4 provide an MFMIS-FET. For storing a bit of data in the MFMIS-FET, mass potential may be applied to the contact vias 402, 404 filled with the electrically conductive material 405, and a bias voltage may be applied to the contact via 403 filled with the electrically conductive material 405, wherein the bias voltage may be positive or negative, depending on whether a logical 0 or a logical 1 is to be stored in the MFMIS-FET. For reading the bit of data stored in the MFMIS-FET, the contact via 403 filled with the electrically conductive material 405 may be maintained at mass potential, and a voltage may be applied between the contact vias 402, 404 filled with the electrically conductive material 405 for applying a voltage between the source region 104 and the drain region 106 of the MFMIS-FET. Since the ferroelectric polarization of the layer 301 of ferroelectric material has an influence on the conductivity of the channel region 105, the ferroelectric polarization of the layer 301 of ferroelectric material and, accordingly, the value of the bit stored in the MFMIS-FET may be sensed by measuring a current flowing between the contact vias 402, 404 filled with the electrically conductive material 405.

Further features employed for storing a bit of data in the MFMIS-FET as illustrated in FIG. 4 may correspond to known techniques for storing bits of data in MFMIS-FETs and reading bits of data from MFMIS-FETs.

The present disclosure is not limited to embodiments wherein a gate-last technique as described above with respect to FIGS. 1-4 is employed. In other embodiments, gate-first techniques may be used, as will be described in the following with reference to FIGS. 5-9.

For convenience, in FIGS. 1-4, on the one hand, and in FIGS. 5-9 on the other hand, sometimes like reference numerals have been used to denote like components. Unless explicitly stated otherwise, features denoted by like reference numerals may have corresponding features and corresponding methods may be employed for the formation thereof.

Figure 5:
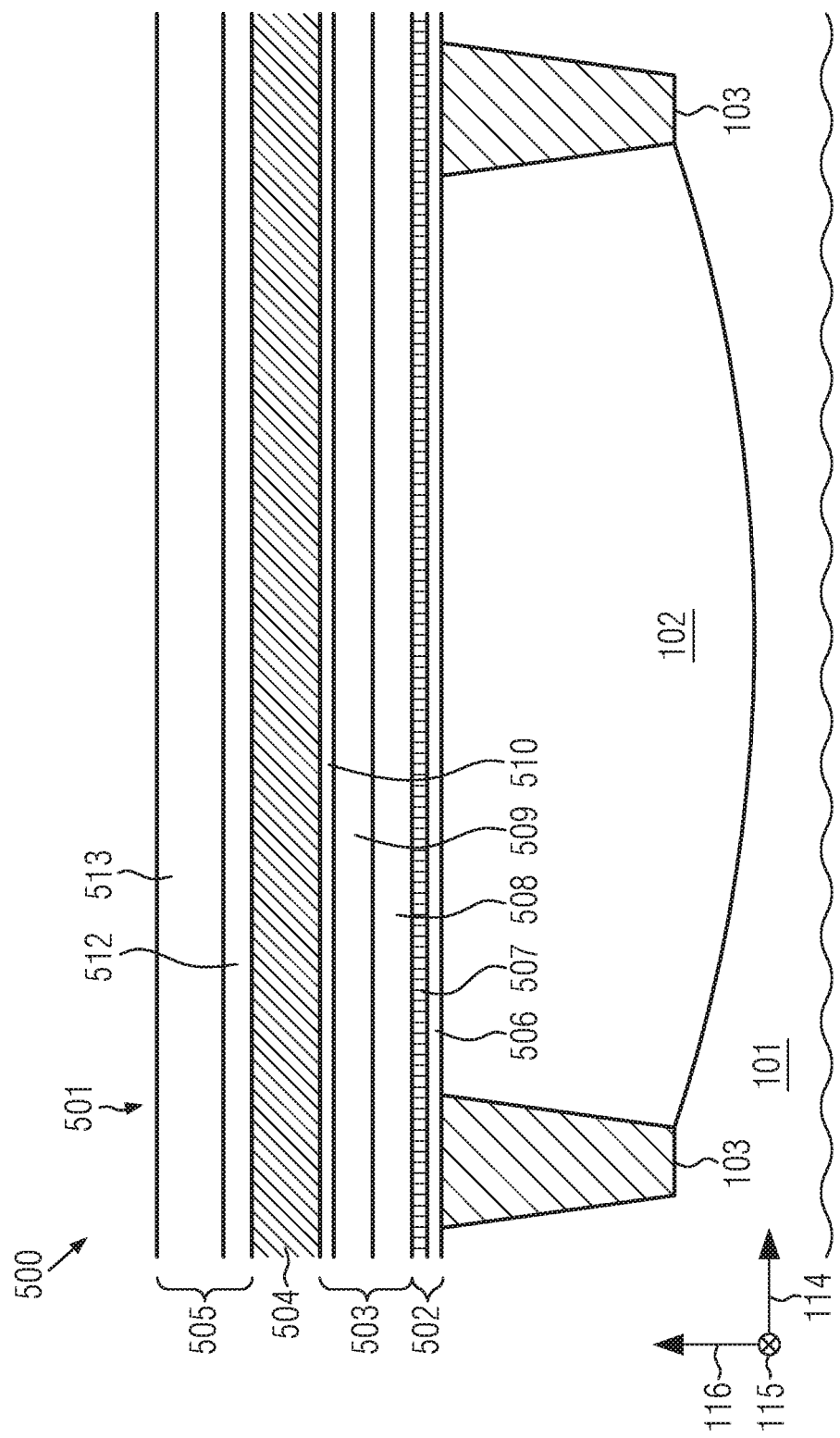
FIGS. 5-9 show schematic views of a semiconductor structure according to an embodiment in stages of a manufacturing process according to an embodiment.

FIG. 5 shows a schematic cross-sectional view of a semiconductor structure 500 according to an embodiment in a stage of a manufacturing process according to an embodiment. The semiconductor structure 500 includes a substrate 101 having a thickness direction 116. A main surface of the substrate 101 may be substantially in a plane that is normal to the thickness direction 116 and spanned by vectors that are parallel to horizontal directions 114, 115. In the MFMIS-FET, which will be formed in the semiconductor structure 500 in later stages of the manufacturing process, a channel length direction substantially corresponds to the horizontal direction 114, and a channel width direction substantially corresponds to the horizontal direction 115.

In the substrate 101, a shallow trench isolation structure 103 may be provided. The shallow trench isolation structure 103 may provide electrical insulation between an active region 102 and other portions of the semiconductor structure 500.

At the stage of the manufacturing process illustrated in FIG. 5, no source and drain regions need to be present in the active region 102, and the entire active region 102 may be doped with the same dopant type. Source and drain regions of the MFMIS-FET that are doped differently than the rest of the active region 102 will be formed in later stages of the manufacturing process, as will be detailed below.

The semiconductor structure 500 further includes a gate stack 501. The gate stack 501 includes a gate insulation material 502 over the substrate 101, a floating gate electrode material 503 over the gate insulation material 502, a ferroelectric transistor dielectric 504 over the floating gate electrode material 503 and a top electrode material 505 over the ferroelectric transistor dielectric 504.

The gate insulation material 502, the floating gate electrode material 503 and the top electrode material 505 need not be homogeneous. In some embodiments, one or more of the gate insulation material 502, the floating gate electrode material 503 and the top electrode material 505 may include sub-layers that are formed of different materials. For example, the gate insulation material 502 may include a sub-layer 506 provided directly on the portion of the semiconductor material of the substrate 101 in the active region 102 and may be formed of silicon dioxide. Additionally, the gate insulation material 502 may include a sub-layer 507 that is provided over the sub-layer 506 and may be formed of a material having a greater dielectric constant than silicon dioxide, for example, hafnium dioxide.

The floating gate electrode material 503 may include a metal layer 508. The metal layer 508 may include a metal or a metal compound, such as, for example, titanium nitride. Additionally, the floating gate electrode material 503 may include a polysilicon layer 509 that is provided over the metal layer 508. As will be detailed below, in addition to providing a portion of a floating gate electrode of the MFMIS-FET to be formed in the semiconductor structure 500, the polysilicon layer 509 may be used as an etch stop layer in a patterning process that will be described below.

In some embodiments, the floating gate electrode material 503 may additionally include a second metal layer 510, which is provided over the polysilicon layer 509, so that the polysilicon layer 509 is arranged between the metal layers 508, 510. The second metal layer 510 may be formed from a same metal or metal compound as the first metal layer 508. For example, the second metal layer 510 may be formed of titanium nitride. A thickness of the second metal layer 510 may be smaller than a thickness of the first metal layer 508 and the polysilicon layer 509.

The top electrode material 505 may include a metal layer 512 that is provided over the ferroelectric transistor dielectric 504 and a polysilicon layer 513 that is provided over the metal layer 512. The metal layer 512 may include a metal or a metal compound, for example, titanium nitride.

For forming the gate insulation material 502, the floating gate electrode material 503 and the top electrode material 505, known deposition techniques for depositing the respective materials such as, for example, chemical vapor deposition, plasma enhanced chemical vapor deposition, atomic layer deposition and/or physical vapor deposition may be employed.

The ferroelectric transistor dielectric 504 may include an oxide including at least one of hafnium and zirconium, for example, hafnium dioxide, zirconium dioxide and/or hafnium zirconium oxide. Features of the ferroelectric transistor dielectric 504 may correspond to features of the ferroelectric transistor dielectric 201 described above with reference to FIG. 2, and corresponding methods may be employed for the formation thereof. In particular, in some embodiments, the as-deposited ferroelectric transistor dielectric 504 need not have ferroelectric properties. Instead, the as-deposited ferroelectric transistor dielectric 504 may have an amorphous structure. After the formation of the metal layer 512 of the top electrode material 505, or after the deposition of the polysilicon layer 513 of the top electrode material 505, an annealing process may be performed. In the annealing process, a crystalline structure of the ferroelectric transistor dielectric 504 having ferroelectric properties may be obtained. In some embodiments, the annealing process may be an annealing process that is performed after the formation of a source region 903 and a drain region 905, as described below with reference to FIG. 9, and is adapted to activate dopants in the source region 903 and the drain region 905, in addition to re-crystallizing the ferroelectric transistor dielectric 504. In such embodiments, the annealing process may be performed at a temperature in a range from about 1000-1100° C.

Figure 6:
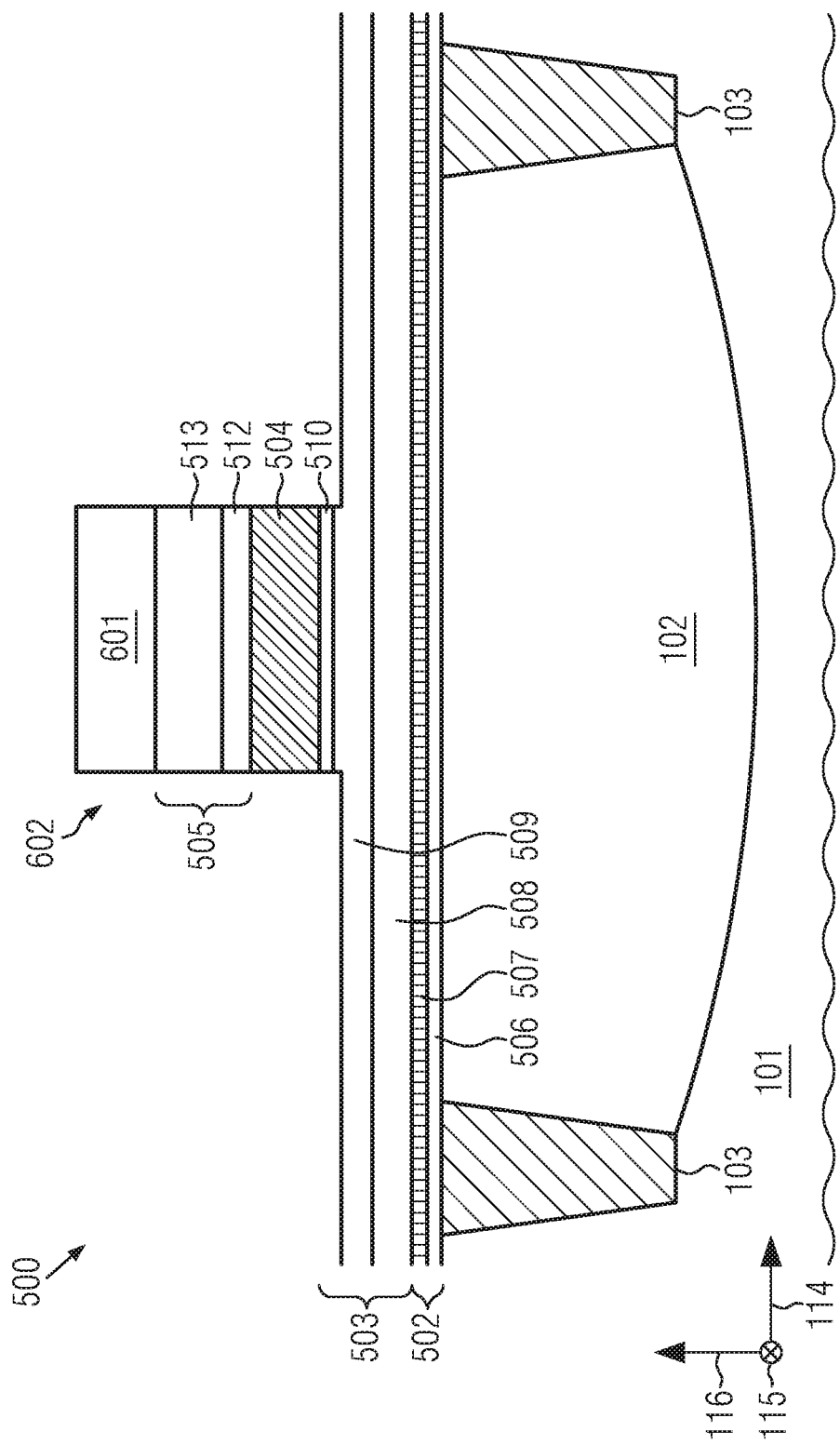

FIG. 6 shows a schematic cross-sectional view of the semiconductor structure 500 in a later stage of the manufacturing process. After the formation of the gate stack 501, a first patterning process may be performed. For this purpose, a mask 601 may be formed over the gate stack 501. The mask 601 may be a hard mask formed from a hard mask material, such as silicon nitride and/or silicon dioxide, and it may be formed by depositing a layer of the hard mask material over the gate stack 501 by means of a deposition process such as chemical vapor deposition, or plasma enhanced chemical vapor deposition, and patterning the layer of the hard mask material by means of techniques of photolithography and etching.

Thereafter, one or more etch processes may be performed for removing portions of the top electrode material 505 and the ferroelectric transistor dielectric 504 which are not covered by the mask 601. In embodiments wherein the floating gate electrode material 503 includes a second metal layer 510 that is arranged below the ferroelectric transistor dielectric 504, in the etch process, portions of the second metal layer 510 that are not covered by the mask 601 may also be removed, so that the polysilicon layer 509 of the floating gate electrode material 503 is exposed. Portions of the top electrode material 505, the ferroelectric transistor dielectric 504 and the second metal layer 510 below the mask 601 remain in the semiconductor structure 100 and form an upper portion 602 of a gate structure of the MFMIS-FET to be formed in the semiconductor structure 500.

In some embodiments, the one or more etch processes that are used for removing the ferroelectric transistor dielectric 504, the top electrode material 505 and, optionally, the second metal layer 510 of the floating gate electrode material 503 may include one or more reactive ion etch processes, wherein parameters of the reactive ion etching such as, for example, a composition of an etch gas employed, as well as a radio frequency power and/or a bias voltage, are varied for obtaining an etching of the different materials that are present in the top electrode material 505, the ferroelectric transistor dielectric 504 and the second metal layer 510.

The polysilicon layer 509 of the floating gate electrode material 503 may be employed as an etch stop layer in the one or more etch processes. At the end of the one or more etch processes, the parameters of the reactive ion etching may be adapted such that the ferroelectric transistor dielectric 504 and/or the metal of the second metal layer 510 are removed selectively with respect to polysilicon, so that only a relatively small amount of the polysilicon in the polysilicon layer 509 is removed and the polysilicon layer 509 is used as an etch stop layer.

Figure 7:
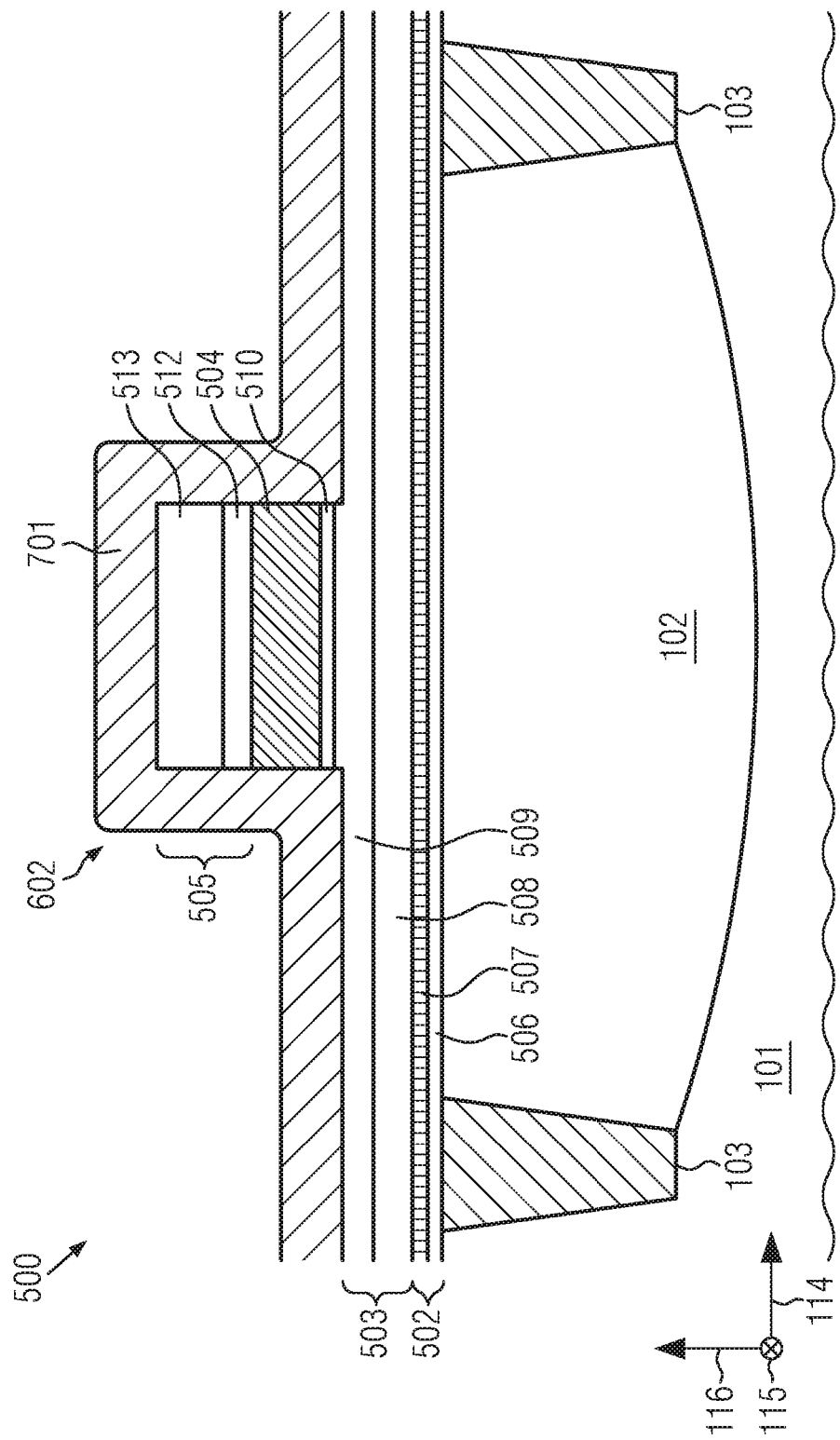

FIG. 7 shows a schematic cross-sectional view of the semiconductor structure 500 in a later stage of the manufacturing process. After the first patterning process, the mask 601 may be removed by means of an etch process. Thereafter, a first liner layer 701 may be deposited over the semiconductor structure. The first liner layer 701 may include an electrically insulating material such as, for example, silicon dioxide, and it may be formed by means of deposition techniques such as chemical vapor deposition and/or plasma enhanced chemical vapor deposition.

In some embodiments, the first liner layer 701 may have a thickness that is smaller than a total thickness of the ferroelectric transistor dielectric 504, the top electrode electric material 505 and the second metal layer 510, corresponding to a total height of the upper portion 602 of the gate structure as illustrated in FIG. 7. In other embodiments, a thickness of the first liner layer 701 may be greater than the height of the upper portion 602 of the gate structure so that a complete fill of regions adjacent the upper portion of the gate structure 602 is obtained. In such embodiments, the first liner layer 701 may have features corresponding to those of known field oxides that are employed in the manufacturing of integrated circuits.

The first liner layer 701 includes portions which are provided on sidewalls of the upper portion 602 of the gate structure as well as portions that are arranged over the upper portion 602 of the gate structure and portions of the surface of the polysilicon layer 509 of the floating gate electrode material 503 that are exposed adjacent the upper portion 602 of the gate structure.

Figure 8:
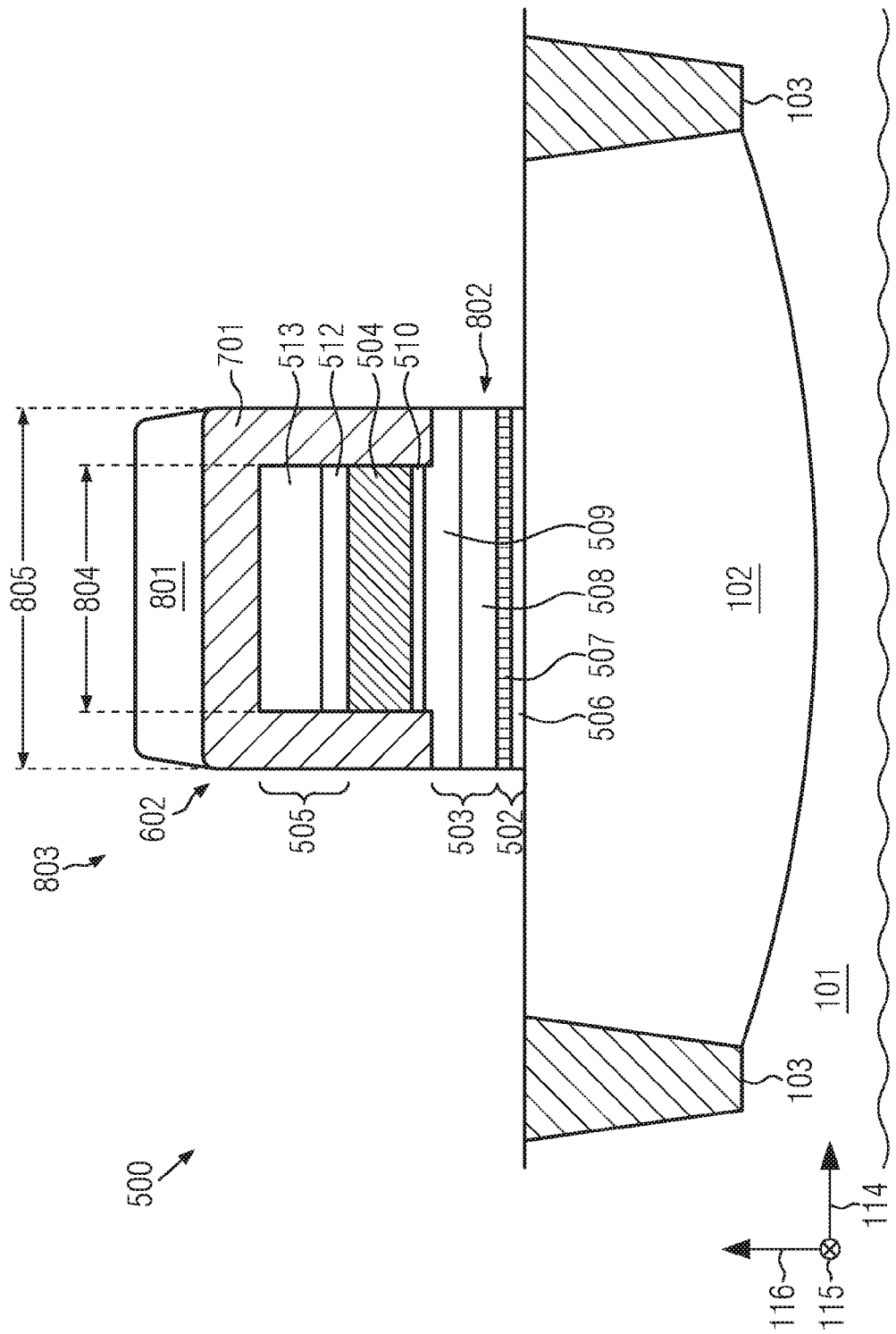

FIG. 8 shows a schematic cross-sectional view of the semiconductor structure 500 in a later stage of the manufacturing process. After the deposition of the first liner layer 701, a second patterning process may be performed. In the second patterning process, a further hard mask 801 may be formed over the semiconductor structure 500. Similar to the hard mask 601, the hard mask 801 may be formed by depositing a layer of a hard mask material over the semiconductor structure 500 and patterning the layer of hard mask material by means of techniques of photolithography and etching. A material of the hard mask 801 may be selected such that the material of the first liner layer 701 may be etched selectively relative to the material of the hard mask 801. In particular, in embodiments wherein the first liner layer 701 includes silicon dioxide, the hard mask 801 may include silicon nitride.

As illustrated in FIG. 8, the hard mask 801 may be provided above the upper portion 602 of the gate structure, and it may have an extension in the channel length direction 114 that is greater than an extension 804 of the upper portion 602 of the gate structure in the channel length direction 114. Additionally, an extension of the hard mask 801 in the channel width direction 115 (perpendicular to the plane of drawing of FIG. 8) may be greater than an extension of the upper portion 602 of the gate structure in the channel width direction 115. Thus, the hard mask 801 may cover portions of the first liner layer 701 as well as portions of the gate insulation material 502 and the floating gate electrode material 503 that are adjacent the upper portion 602 of the gate structure.

After the formation of the mask 801, one or more etch processes adapted to remove the floating gate electrode material 503 and the gate insulation material 502 may be performed. In some embodiments, the one or more etch processes may include one or more reactive ion etch processes. The one or more etch processes may be stopped as soon as the portion of the semiconductor material of the substrate 101 in the active region 102 is exposed at the surface of the semiconductor structure 500.

Portions of the floating gate electrode material 503 and the gate insulation material 502 that are covered by the mask 801 during the one or more etch processes may remain in the semiconductor structure 500, and may form a lower portion 802 of the gate structure of the MFMIS-FET to be formed in the semiconductor structure 500. In FIG. 8, the gate structure, which includes both the upper portion 602 and the lower portion 802, is denoted by reference numeral 803.

Portions of the first liner layer 701 which are covered by the mask 801 may also remain in the semiconductor structure 500.

The dimensions of the lower portion 802 of the gate structure 803 are defined by the extension of the mask 801. Therefore, an extension 805 of the lower portion 802 of the gate structure 803 in the channel length direction 114 is greater than an extension 804 of the upper portion 602 of the gate structure 803 in the channel length direction. Accordingly a top electrode of the gate structure 803, which is provided by portions of the top electrode material 505 that were not removed in the first patterning process, has a smaller extension in the channel length direction 114 than a floating gate electrode that is provided by the portion of the floating gate electrode material 503 that was not removed in the second patterning process.

Similarly, an extension of the upper portion 602 of the gate structure 803 in the channel width direction 115 and, accordingly, an extension of the top electrode in the channel width direction 115, may be greater than an extension of the lower portion 802 of the gate structure 803 and, accordingly, an extension of the floating gate electrode in the channel width direction 115. Hence, similar to the embodiments described above with reference to FIGS. 1-4, a projected area of the top electrode onto a plane that is perpendicular to the thickness direction 116 of the semiconductor substrate 101 may be smaller than a projected area of the floating gate electrode onto the plane.

Figure 9:
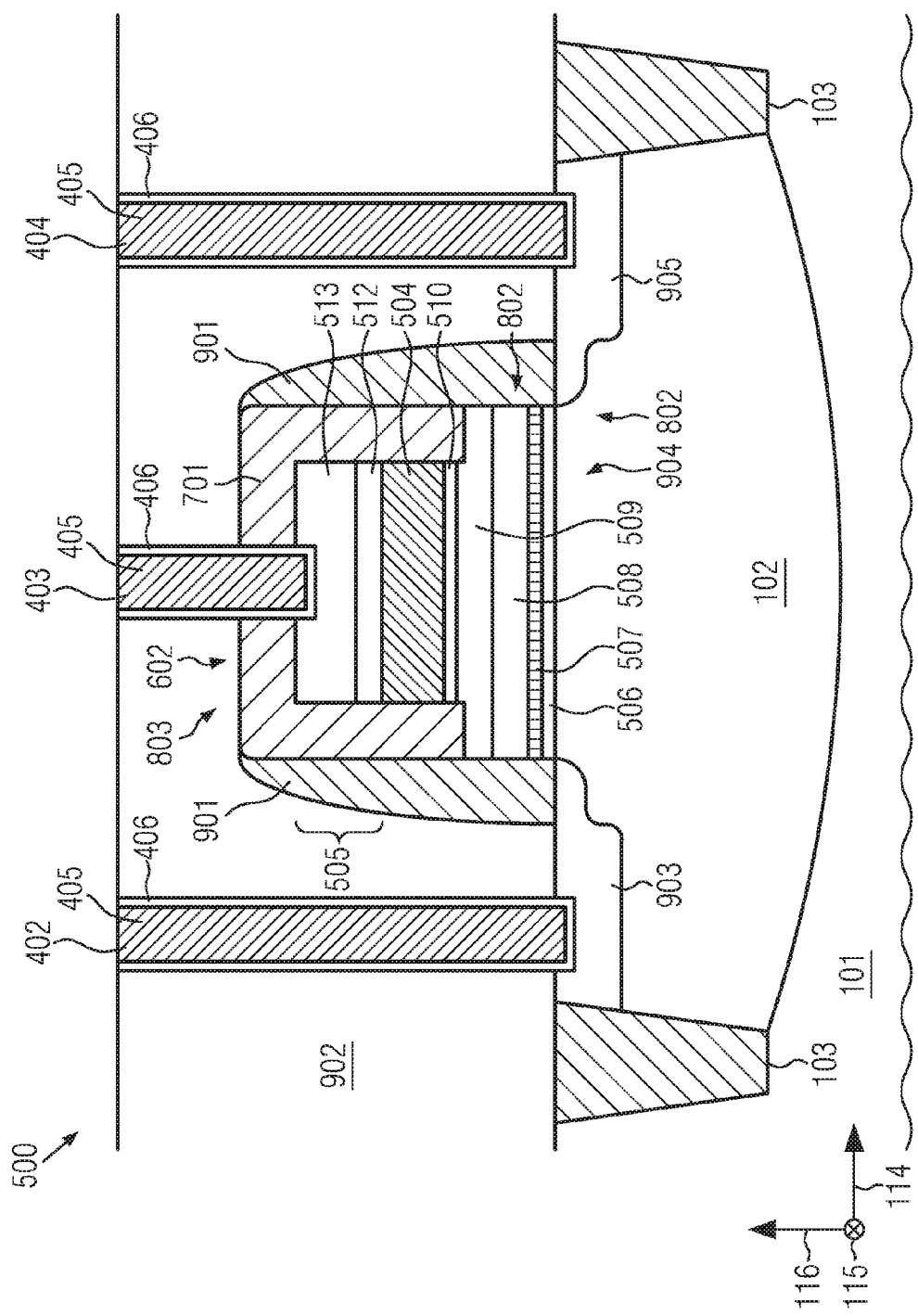

FIG. 9 shows a schematic cross-sectional view of the semiconductor structure 500 in a later stage of the manufacturing process. After the second patterning process, the mask 801 may be removed. Similar to the removal of the mask 601 described above, this may be done by means of an etch process that is adapted to selectively remove the material of the mask 801 relative to other materials in the semiconductor structure 500, in particular relative to the materials of the first liner layer 701 and the substrate 101.

Thereafter, a second liner layer 901 may be deposited over the semiconductor structure 500. The second liner layer 901 may be formed of a material that may be etched selectively relative to the material of the first liner layer 701. For example, in embodiments wherein the first liner layer 701 includes silicon dioxide, the second liner layer 901 may include silicon nitride. The second liner layer 901 may be formed by means of a substantially isotropic deposition process such as, for example, chemical vapor deposition and/or plasma enhanced chemical vapor deposition. After the deposition of the second liner layer 901, an anisotropic etch process may be performed for removing portions of the second liner layer 901 on top of the gate structure 803 and substantially horizontal portions of the substrate 101 adjacent the gate structure 803. Portions of the liner layer 901 on the sidewalls of the gate structure 803 may remain in the semiconductor structure 500, as shown in FIG. 9, and may form a sidewall spacer structure. Furthermore, a source region 903 and a drain region 905 may be formed adjacent the gate structure 803. This may be done by means of one or more ion implantation processes wherein dopants are introduced into the semiconductor structure 500. In some embodiments, ion implantation processes for forming the source region 903 and the drain region 905 may be performed both before the deposition of the second liner layer 901, and after the removal of portions of the second liner layer 901 over substantially horizontal portions of the semiconductor structure 500 for obtaining a desired dopant profile of the source region 903 and the drain region 905 adjacent the gate structure 803, as illustrated schematically in FIG. 9.

Portions of the active region 102 below the gate structure 803 may be protected from irradiation with ions by the gate structure 803 during the one or more ion implantation processes that are performed for forming the source region 903 and the drain region 905, so that a channel region 904 is provided between the source region 903 and the drain region 905. A doping of the channel region 904 may substantially correspond to the original doping of the active region 102, so that the channel region 904 is doped differently than the source region 903 and the drain region 905.

After the formation of the source region 903 and the drain region 905, a further interlayer dielectric 902 may be deposited over the semiconductor structure 500, and contact vias 402, 403, 404, wherein an electrically conductive material 405 and, optionally, a barrier layer 406 are provided, may be formed in the interlayer dielectric 902. The contact vias 402, 403, 404 filled with the electrically conductive material 405 may provide electrical connections to the source region 903, the drain region 905 and the top electrode provided by the portion of the top electrode material 505 in the upper portion 602 of the gate electrode structure 803.

In some embodiments, process steps that are performed in the formation of MFMIS-FETs as described above may also be used in the formation of logic transistors in the same semiconductor structure. Forming logic transistors and MFMIS-FETs in the same semiconductor structure may be performed for providing embedded memory wherein MFMIS-FETs are used for storing bits of data in an integrated circuit that also includes logic circuitry. In the following, such embodiments will be described with reference to FIGS. 10 and 11.

Figure 10:
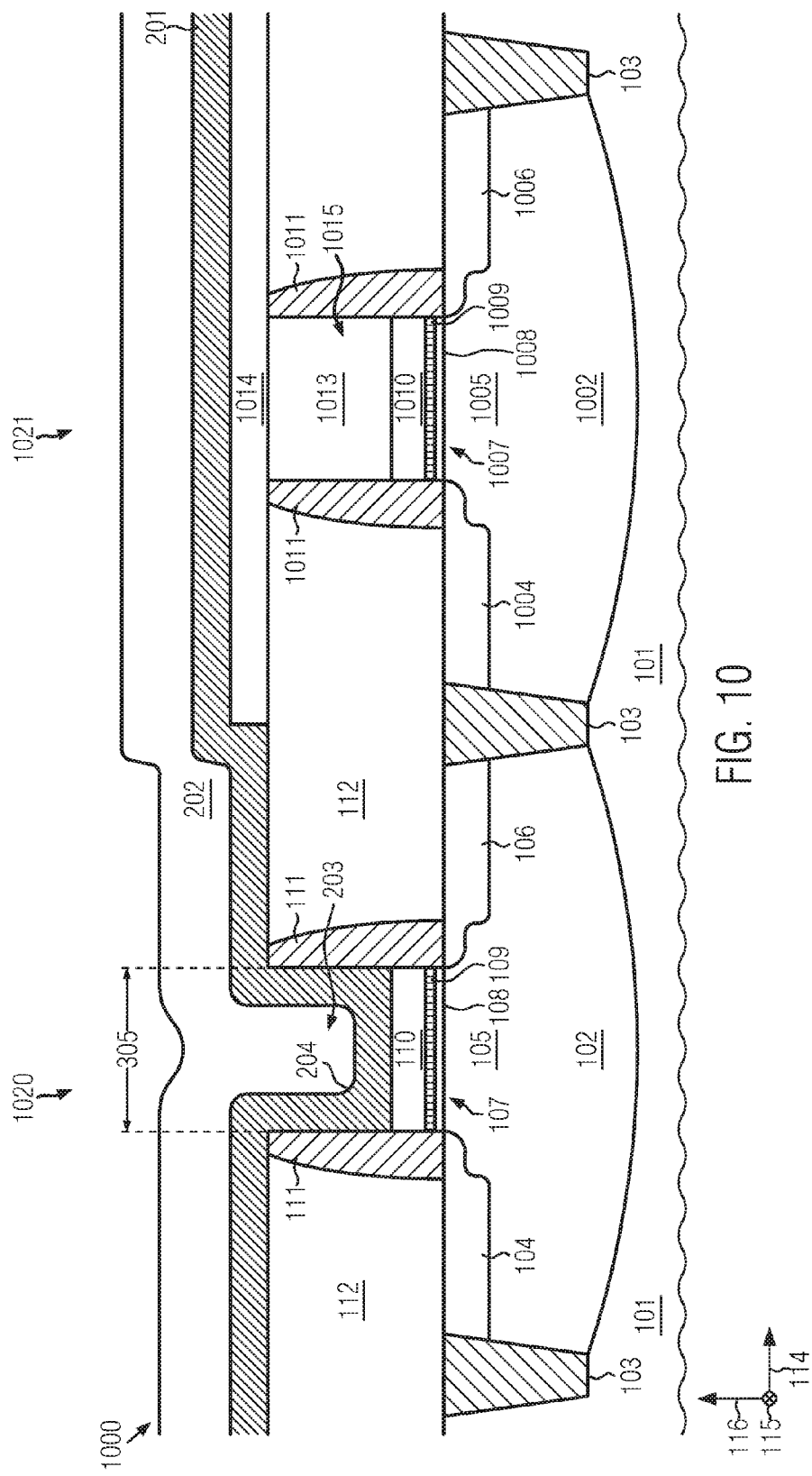
FIG. 10 shows a schematic view of a semiconductor structure according to an embodiment in a stage of a manufacturing process according to an embodiment.

FIG. 10 shows a schematic cross-sectional view of a semiconductor structure 1000 according to an embodiment in a stage of a manufacturing process according to an embodiment. For convenience, in FIGS. 1-4, on the one hand, and in FIG. 10, on the other hand, like reference numerals have been used to denoted like components. Unless explicitly stated otherwise, components denoted by like reference numerals may have corresponding features, and corresponding methods may be employed for the formation thereof. Hence, a detailed description thereof will sometimes be omitted.

The semiconductor structure 1000 includes an MFMIS-FET region 1020 and a logic transistor region 1021 formed at a substrate 101. In the MFMIS-FET region 1020, a MFMIS-FET will be formed, wherein FIG. 10 shows the MFMIS-FET in a stage of a manufacturing process corresponding to that shown in FIG. 2. The MFMIS-FET region 1020 includes an active region 102, wherein a source region 104, a channel region 105 and a drain region 106 are provided. Above the channel region 105, a gate insulation layer 107 including a sub-layer 108, which may be formed of silicon dioxide, and a sub-layer 109, which may be formed of a high-k dielectric material having a greater dielectric constant than silicon dioxide, may be provided. Furthermore, the MFMIS-FET region 1020 includes a floating gate electrode 110 and a sidewall spacer 111 annularly enclosing a space 203 above the floating gate electrode 110, the space 203 having an extension 305 in the horizontal direction 114.

The logic transistor region 1021 includes an active region 1002 wherein a source region 1004, a channel region 1005 and a drain region 1006 are provided. Above the channel region 1005, a gate insulation layer 1007 including sub-layers 1008 and 1009, and a gate electrode structure 1015 including gate electrode portions 1010, 1013 are provided. In some embodiments, the gate electrode portion 1013 may be a dummy gate electrode, which will be removed in later stages of the manufacturing process. Adjacent the gate electrode structure 1015, sidewall spacers 1011 may be provided.

The semiconductor structure 1000 further includes a trench isolation structure 103 and an interlayer dielectric 112.

For forming the above-mentioned features of the semiconductor structure 1000, known techniques of semiconductor processing may be used, wherein, in the MFMIS-FET region 1020, a dummy gate electrode similar to the dummy gate electrode 113 described above with reference to FIG. 1 may be formed over the floating gate electrode 110. The gate insulation layers 107, 1007, the floating gate electrode 110, the dummy gate electrode of the MFMIS-FET region 1020 and the gate electrode portions 1010, 1013 in the logic transistor region 1021 may be formed by patterning a common gate stack by means of a patterning process including photolithography and etching.

Thus, the sub-layers 108, 1008 of the gate insulation layers 107, 1007 may be formed of substantially the same material and the sub-layers 109, 1009 may be formed of substantially the same material. Moreover, the gate electrode portion 1010 in the logic transistor region 1021 may be formed of substantially the same material as the floating gate electrode 110, and the gate electrode portion 1013 may be formed of substantially the same material as the dummy gate electrode in the MFMIS-FET region 1020.

The sidewall spacers 111, 1011 may be formed from a common layer of sidewall spacer material, which may be substantially isotropically deposited over the semiconductor structure 1000 and etched anisotropically for forming the sidewall spacers 111, 1011.

In embodiments wherein the logic transistor to be formed in the logic transistor region 1021 and the MFMIS-FET to be formed in the MFMIS-FET region 1020 are transistors of the same type (P-channel or N-channel, respectively), common ion implantation processes may be employed for doping the active regions 102 and 1002. In other embodiments, one of the MFMIS-FET region 1020 and the logic transistor region 1021 may be covered by a mask, for example, a photoresist mask, while ions are implanted into the other one of the MFMIS-FET region 1020 and the logic transistor region 1021, for forming an MFMIS-FET and a logic transistor of different type.

As described above with reference to FIG. 2, the dummy gate electrode provided in the MFMIS-FET region 1020 may be removed for providing the space 203 above the floating gate electrode 110. In doing so, the logic transistor region 1021 may be covered by a hard mask 1014 so that the gate electrode portion 1013 is not removed. Features of the hard mask 1014 may correspond to those of hard masks employed in conventional double poly removal replacement gate processes wherein gate electrodes of N-channel transistors and P-channel transistors are created separately.

Thereafter, as described above with reference to FIG. 2, a ferroelectric transistor dielectric 201 and an electrically conductive material 202 may be deposited over the semiconductor structure 1000, wherein the portion of the ferroelectric transistor dielectric 201 in the space 203 has a recess 204, so that there is a portion of the electrically conductive material 202 in the space 203.

Then, processing of the semiconductor structure may be continued as described above with reference to FIGS. 3a, 3b and 4. In some embodiments, a further replacement gate process may be performed for replacing the gate electrode portion 1013 with a final gate electrode portion of the logic transistor to be formed in the logic transistor region 1021, for example, before depositing a further interlayer dielectric and forming contact vias as described above with reference to FIG. 4. In doing so, the MFMIS-FET region 1020 may be covered by a hard mask similar to the hard mask 1014.

In other embodiments, a replacement gate process for replacing the gate electrode portion 1013 in the logic transistor region with a final gate electrode portion of the logic transistor which, in combination with the gate electrode portion 1010, provides the gate electrode 1015 of the logic transistor, may be performed before the formation of the hard mask 1014 over the logic transistor region 1021 and the removal of the dummy gate electrode from the MFMIS-FET region 1020.

In the following, further embodiments will be described with reference to FIG. 11. For convenience, in FIGS. 5-9, on the one hand, and in FIG. 11, like reference numerals have been used to denote like components. Unless explicitly stated otherwise, components denoted by like reference numerals may have corresponding features, and corresponding methods may be employed for the formation thereof. Hence, a detailed description thereof will sometimes be omitted.

FIG. 11 shows a schematic cross-sectional view of a semiconductor structure 1100 according to an embodiment in a stage of a manufacturing process according to an embodiment. The semiconductor structure 1100 includes an MFMIS-FET region 1120 and a logic transistor region 1121 formed at a substrate 101. In the MFMIS-FET region 1120, a MFMIS-FET will be formed, and a logic transistor will be formed in the logic transistor region 1121. A shallow trench isolation structure 103 provides electrical isolation between the MFMIS-FET region 1120 and the logic transistor region 1121, and between the regions 1120, 1121 and other circuit elements (not shown) in the semiconductor structure 1100.

The MFMIS-FET region 1120 includes an active region 102. Over the active region 102, a gate structure 803 is provided. The gate structure 803 includes a lower portion 802 and an upper portion 602, wherein reference numeral 804 denotes an extension of the upper portion 602 in a horizontal direction 114, and reference numeral 805 denotes an extension of the lower portion 802 in the horizontal direction 114. Above and adjacent the upper portion 602 of the gate structure 803, there is a portion of a liner layer 701.

The logic transistor region 1121 includes an active region 1102. Over the active region, a gate structure 1103 is provided, over which there may be another portion of the liner layer 701.

The gate structures 803, 1103 may be formed using techniques as described above with reference to FIGS. 5-8. The gate structures 803, 1103 may be formed from a common gate stack having features corresponding to that of the gate stack 501 described above with reference to FIG. 5. Thus, the lower portion 802 of the gate structure 803, and the gate structure 1103 may include portions of a gate insulation material 502 including sub-layers 506, 507 and a floating gate electrode material 503 including a metal layer 508 and a polysilicon layer 509.

The upper portion 602 of the gate structure 803 may include portions of a ferroelectric transistor dielectric 504 and a top electrode material 505 that includes a metal layer 512 and a polysilicon layer 513. Optionally, a second metal layer 510 of the floating gate electrode material 503 may also be provided.

After the formation of the gate stack, a first patterning process as described above with reference to FIG. 6 may be performed. In the first patterning process, in addition to removing portions of the ferroelectric transistor dielectric 504, the top electrode material 505 and, optionally, the second metal layer 510 of the floating gate electrode material 503 over the MFMIS-FET region 1120, as described above with reference to FIG. 6, portions of these materials over the logic transistor region 1121 may also be removed.

Thereafter, the liner layer 701 may be deposited over the semiconductor structure 1100, as described above with reference to FIG. 7.

Then, a second patterning process may be performed, as described above with reference to FIG. 8. In the second patterning process, a mask 801 may be employed. In addition to covering the upper portion 602 of the gate structure 803 and portions of the liner layer 701 adjacent the upper portion 602 of the gate structure, as detailed above with reference to FIG. 8, a portion of the mask 801 may be provided over portions of the logic transistor region 1121 wherein the gate structure 1103 of the logic transistor is to be formed. Thereafter, one or more etch processes adapted to remove the material of the liner layer 701, the floating gate electrode material 503 and the gate insulation material 502 may be performed to obtain a configuration as shown in FIG. 11.

Accordingly, the lower portion 802 of the gate structure 803 formed at the MFMIS-FET region 1120 and the gate structure 1103 formed at the logic transistor region 1121 may be formed from the same gate stack in a common patterning process.

Thereafter, processing of the semiconductor structure 1100 may be continued as described above with reference to FIG. 9. The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method, comprising:
   providing a semiconductor structure, said semiconductor structure comprising a semiconductor substrate and a gate stack, said gate stack comprising a gate insulation material over said substrate, a floating gate electrode material over said gate insulation material, a ferroelectric transistor dielectric over said floating gate electrode material and a top electrode material over said ferroelectric transistor dielectric;
   performing a first patterning process, said first patterning process removing portions of said top electrode material and said ferroelectric transistor dielectric, portions of said top electrode material and said ferroelectric transistor dielectric that are not removed in said first patterning process forming an upper portion of a gate structure, portions of said floating gate electrode material and said gate insulation material that are not covered by said upper portion of said gate structure remaining in said semiconductor structure;
   forming a liner layer above said gate stack after performing said first patterning process;
   forming a mask layer above a portion of said liner layer above said upper portion of said gate structure; and
   performing a second patterning process after said first patterning process using said liner layer and said mask layer, said second patterning process removing portions of said first liner layer, said floating gate electrode material, and said gate insulation material not covered by said mask layer, portions of said floating gate electrode material and said gate insulation material that are not removed in said second patterning process forming a lower portion of said gate structure;
   wherein a projected area of said upper portion of said gate structure onto a plane that is perpendicular to a thickness direction of said substrate is smaller than a projected area of said lower portion of said gate structure onto said plane.

2. The method of claim 1, further comprising, after said second patterning process, depositing a second liner layer over said semiconductor structure.

3. The method of claim 2, further comprising etching said second liner layer to form spacers adjacent said first liner layer remaining on said upper portion.

4. The method of claim 1, wherein said ferroelectric transistor dielectric comprises an oxide comprising at least one of hafnium and zirconium.

5. The method of claim 1, wherein said floating gate electrode material comprises a first metal layer and a polysilicon layer.

6. The method of claim 5, wherein said floating gate electrode material further comprises a second metal layer, said polysilicon layer being arranged between said first metal layer and said second metal layer.

7. The method of claim 1, wherein said top electrode material comprises a metal layer and a polysilicon layer.

8. The method of claim 1, further comprising forming a logic transistor having a gate structure, wherein at least portions of said gate structure of said logic transistor are formed from said gate stack.

* * * * *